(12) United States Patent
Yeh

(10) Patent No.: US 7,708,579 B2
(45) Date of Patent: May 4, 2010

(54) SOCKET ASSEMBLY WITH BACKPLANE

(75) Inventor: Cheng-Chi Yeh, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/380,870

(22) Filed: Mar. 3, 2009

(65) Prior Publication Data

US 2009/0221162 A1 Sep. 3, 2009

(30) Foreign Application Priority Data

Mar. 3, 2008 (TW) .............................. 97203554 U
Jul. 29, 2008 (TW) .............................. 97213399 U

(51) Int. Cl.
*H01R 13/62* (2006.01)

(52) U.S. Cl. ......................................... 439/331; 439/73

(58) Field of Classification Search ................... 439/73, 439/331, 564, 565, 573; 361/719
See application file for complete search history.

(56) References Cited

U.S. PATENT DOCUMENTS

| | | | |
|---|---|---|---|
| 6,607,396 B1 * | 8/2003 | Ito .............................. | 439/331 |
| 6,790,069 B2 * | 9/2004 | Okita et al. ................. | 439/331 |
| 6,791,838 B1 * | 9/2004 | Hung et al. ................. | 361/704 |
| 7,042,727 B2 * | 5/2006 | Ulen et al. .................. | 361/704 |
| 7,136,287 B2 * | 11/2006 | Yang et al. .................. | 361/704 |
| 7,352,586 B2 * | 4/2008 | Kuang et al. ................ | 361/719 |

* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

A socket assembly mounted on a printed circuit board comprises a socket mounted upon the printed circuit board; a metal backplane, mounted below the printed circuit board and configured with a board-like shape; and an insulative sheet. The insulative sheet is sandwiched between the printed circuit board and the metal backplane and is formed with at least one latching portion extending downwardly to latch the metal backplane. The insulative sheet further has a plurality of protruding portions extending upwardly to insert into corresponding circular holes defined on of the printed circuit board.

3 Claims, 8 Drawing Sheets

SOCKET ASSEMBLY WITH BACKPLANE

BACKGROUND OF THE INVENTION

1. Field of the Invention

The present invention relates to a socket assembly, and more particularly, to a socket assembly for use with included an insulated reinforced plate having a printed circuit board sandwiched therebetween

2. Description of the Related Art

Present computer usually has a high speed and double data transmission rate and continually works for a long time. As a result, a powerful CPU (Center Process Unit) of the computer brings up more and more heat. Therefore a heat sink is required to dissipate the heat during a normal work of the computer. When such a heat sink including a plurality of metal fins is mounted on top of a socket, which is mounted on a PCB and adapted to electrically interconnect the CPU and the PCB. Since the PCB can not endure so heavy weigh, a backplane is assembled on a bottom surface of the PCB to strengthen the PCB. In the existing application, the heat sink is locked to a so called retention module (RM) which is bolted onto the PCB. In addition, the socket assembly includes a stiffener which is bolted to a reinforced backplane disposed on the underside of the PCB. In order to effectively dissipate heat from the CPU, the heat sink must press hardly against to a top surface of the CPU. Inevitably, the spring load will also are transferred to the CPU and the socket on which the CPU is mounted. As a result, the backplane mentioned plays a vital role in this application.)

Commonly, typical backplanes include two types, one is configured by plastic, another is formed by metal. The plastic backplane has a simple manufacture process and can be manufactured with a lower cost, but it can not provide a sufficient rigidity to support the socket assembly. A socket assembly 100' shown in FIG. 1 includes a socket 1' which electrically connect an semiconductor package 5' to a PCB 3', and a metal backplane 4' is disposed on the backside of the PCB. The metal backplane 4' has a high rigidity and can well properly support the PCB. However, the metal backplane 4' must be insulated from the PCB to prevent short circuiting conductive traces of the PCB, an improved design is to dispose a soft insulative film (not shown) on a metal plane over a surface facing the PCB. The soft insulative film is attached to the metal plane by agglutinant to be integral backplane, then a plurality of screws are used to assemble the socket, the PCB, the soft insulative sheet and the metal plane to assemble them together.

Each of the soft insulative film and the metal plane defines a plurality of mounting holes for the screw passing there through. However, since the soft insulative sheet agglutinates to the metal plane, crimple airs and bladders may occur over the surface of the backplane, and it may takes time to align the mounting holes of the soft insulative sheet with that of the metal backplane. Furthermore, it is also not an easy thing to accurately position the insulative sheet together with the metal plane to the PCB for there is no positioning member between the insulative sheet and the PCB.

Hence, it is required to improve the disadvantages of the above sockets.

SUMMARY OF THE INVENTION

An object of the invention is to provide a socket assembly having an insulative sheet which is easily attached to the backplane.

To achieve the above-mentioned object, a socket assembly mounted on a printed circuit board comprises: a socket mounted upon the printed circuit board; a metal backplane mounted below the printed circuit board and configured with a board-like shape; and an insulative sheet sandwiched between the printed circuit board and the metal backplane. The insulative sheet is formed with at least one latching portion extending downwardly to latch corresponding side of the metal backplane.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiments of the present invention.

Figure 1:
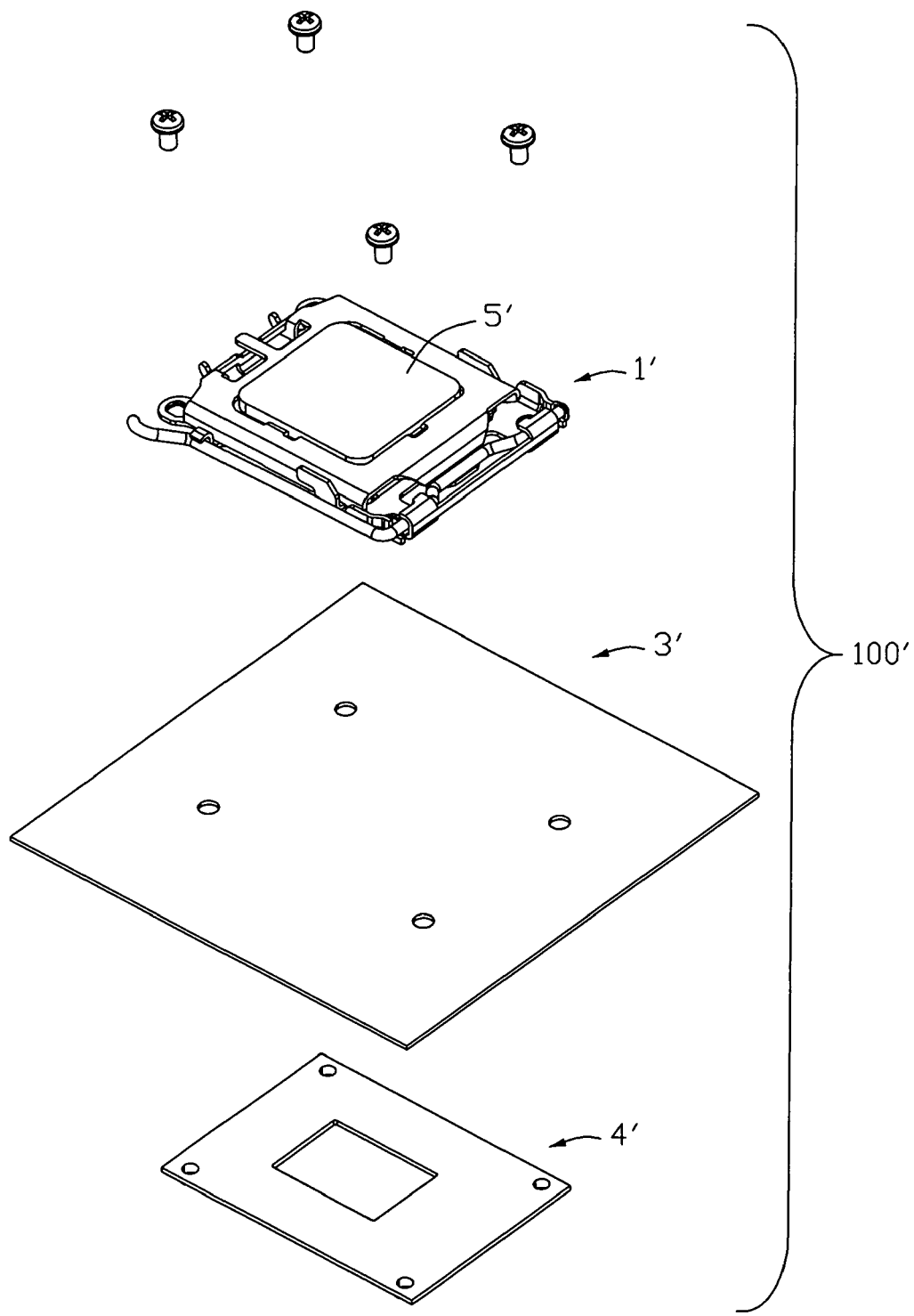
FIG. 1 is a partially assembled, perspective view of a conventional socket assembly.
Figure 2:
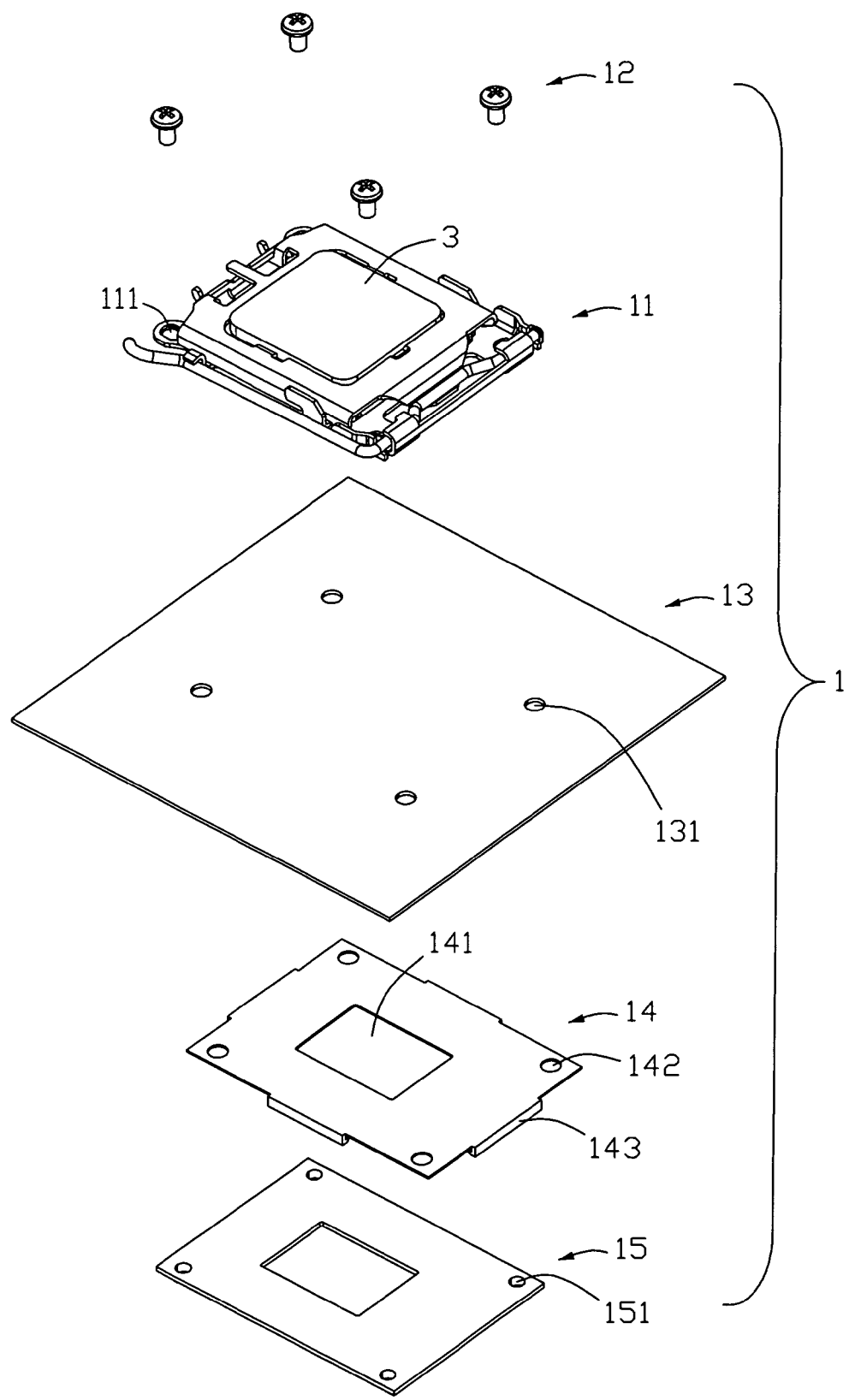
FIG. 2 is a partially assembled, perspective view of a socket assembly in accordance with a first preferred embodiment of present invention.
Figure 3:
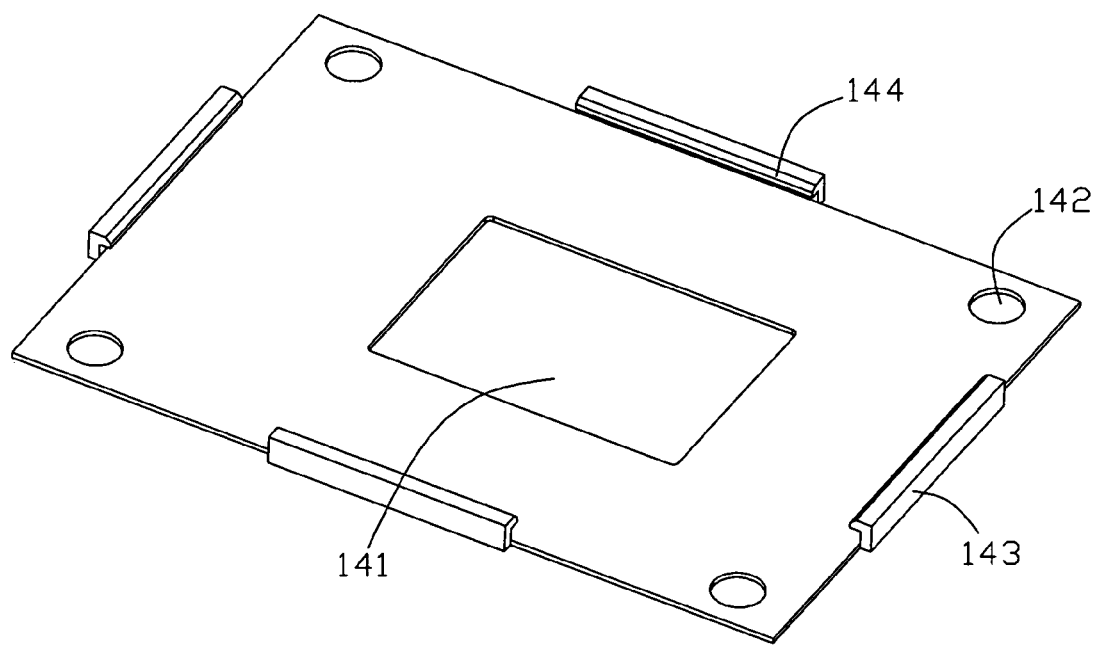
FIG. 3 is a perspective view of an insulative sheet of the socket assembly shown in FIG. 2, taken from another side.
Figure 4:
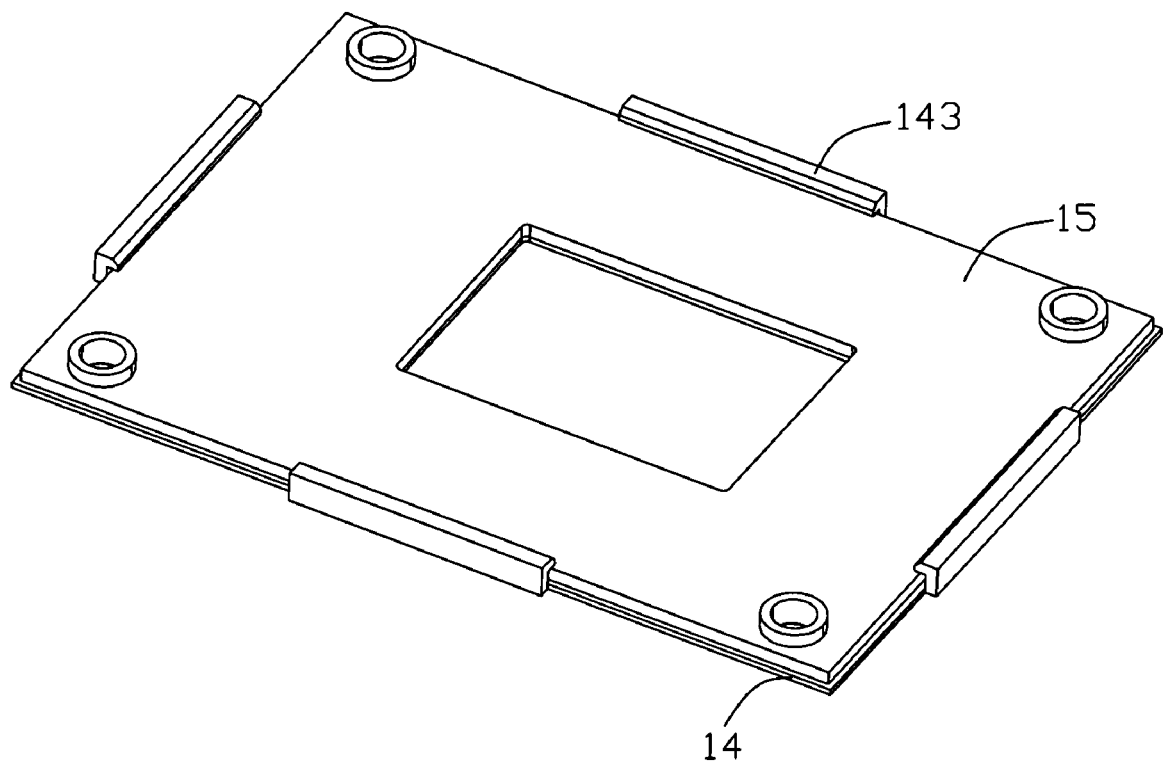
FIG. 4 is an assembled, perspective view of the insulative sheet and a metal plane of the socket assembly shown in FIG. 2.
Figure 5:
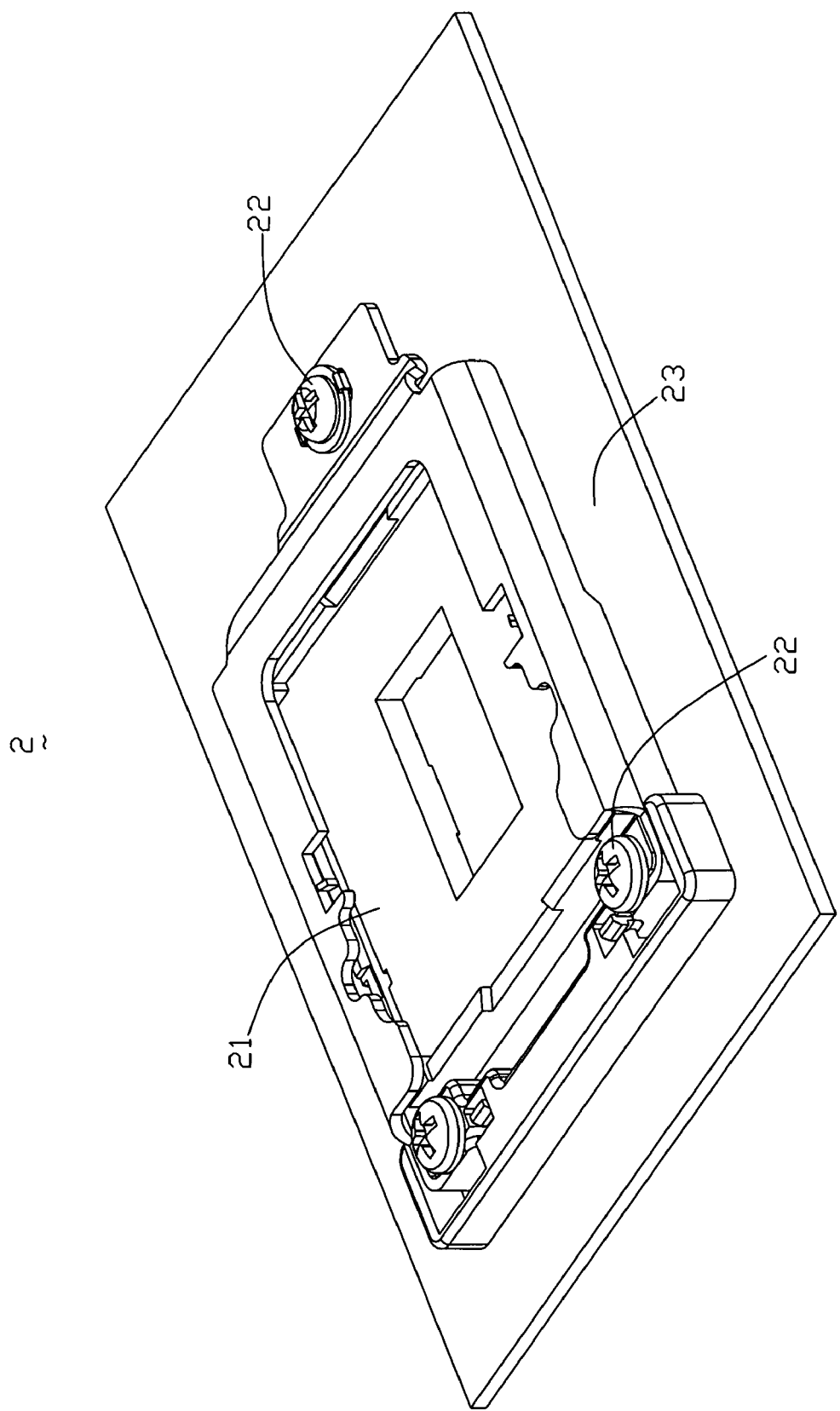
FIG. 5 is an assembled, perspective view of a socket assembly in accordance with a second preferred embodiment of present invention.
Figure 6:
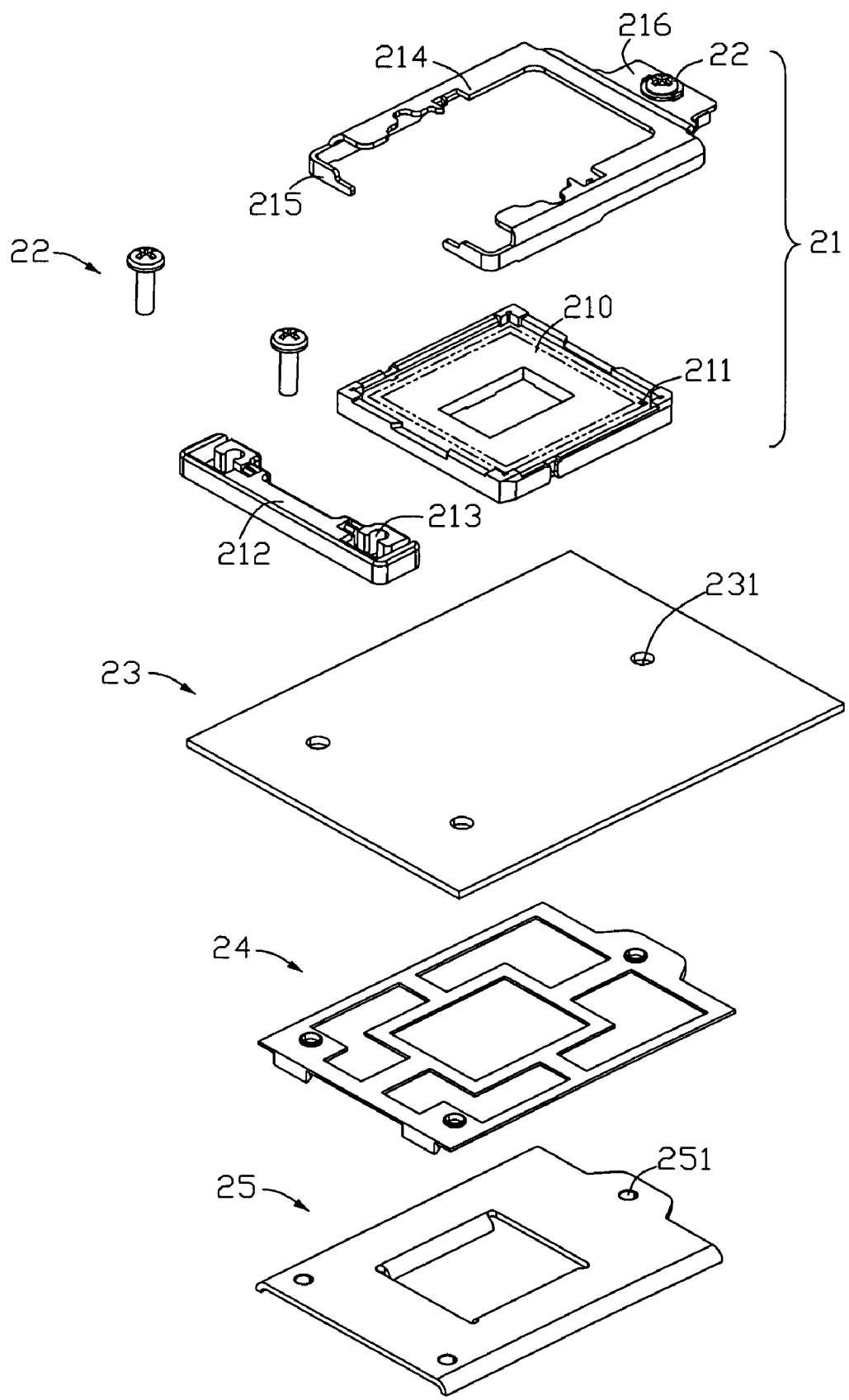
FIG. 6 is an exploded, perspective view of the socket assembly shown in FIG. 5.

Referring to FIGS. 2-4, a socket assembly 1 mounted on a PCB 13 (printed circuit board) in accordance with a first preferred embodiment of present invention, comprises a socket 11, a plurality of fastener 12, an insulative sheet 14 and a metal backplane 15.

The socket 11 is a typical LGA connector, which is mounted upon the PCB 13 and adapted for electrically connecting a semiconductor package 3 to the PCB 13. The socket 11 defines a plurality of mounting holes 111, and the PCB 13 accordingly defines a plurality of circular holes 131.

The metal plane 15, which is formed by metal stamping and is configured with a board-like shape, is mounted to a bottom face of the PCB 13 to strengthen the PCB 13 and defines a plurality of assembling holes 151 according to the circular holes 131 of the PCB 13.

The insulative sheet 14, which is also configured with flat board-like shape with an opening 141 in a center thereof, is sandwiched between the metal backplane 15 and the PCB 13. The insulative sheet 14 defines a plurality of positioning holes 142 according to the circular holes 131 of the PCB 13 and has four latches 143 extending downwardly from a middle portion of each side thereof, respectively, to latch corresponding sides of the metal backplane 15. Referring to FIG. 3, each latch 143 has a guiding surface 144 to guide the metal backplane 15 adjacent to the insulative sheet 14.

The fasteners 12, such as screw, insert through the mounting holes 1 11 of the socket 11, the circular holes 131 of the PCB 13, the positioning holes 142 of the insulative sheet 14 and the assembling holes 151 of the metal backplane 15 in turn to assemble the socket 11, the insulative sheet 14 and the metal backplane 51 together on the PCB 13. The latch portions 143 can easily and correctly attach the insulative sheet 14 on the metal backplane 15 to prevent the insulative sheet 14 from shaking relative to the metal backplane 15.

Referring to FIGS. 5-8, a socket assembly 2 in accordance with a second preferred embodiment of present invention, comprises a socket 21, a plurality of fastener 22, a PCB 23 (printed circuit board), an insulative sheet 24 and a metal backplane 25.

The socket 21 includes a housing 210 mounted on the PCB 23, a pedestal 212 beside the housing 210, a cover 214 pivotally assembled to the pedestal 212 to cover the housing 210. The housing 210 defines a plurality of passageways 211 in array receiving a plurality of contacts (not shown) therein. The pedestal 212 is formed by plastic material, and defines a pair of mounting holes 213 on two longitudinal ends thereof. The cover 214 has two horizontal tails 215, the fasteners 22 pass through the mounting holes 213 and set upon the tails 215 to pivotally assemble the cover 214 on the pedestal 212. The cover 214 further has a tongue portion 216 extending from another side opposed to the tails and is attached with another fastener 22.

The PCB 23 defines three circular holes 231 for above three fasteners 22 passing through, respectively. The metal plane 15, which is formed by metal stamping and is configured with a board-like shape, is mounted to a bottom face of the PCB 23 to strengthen the PCB 23 and defines three assembling holes 251 according to the circular holes 231 of the PCB 23.

Figure 7:
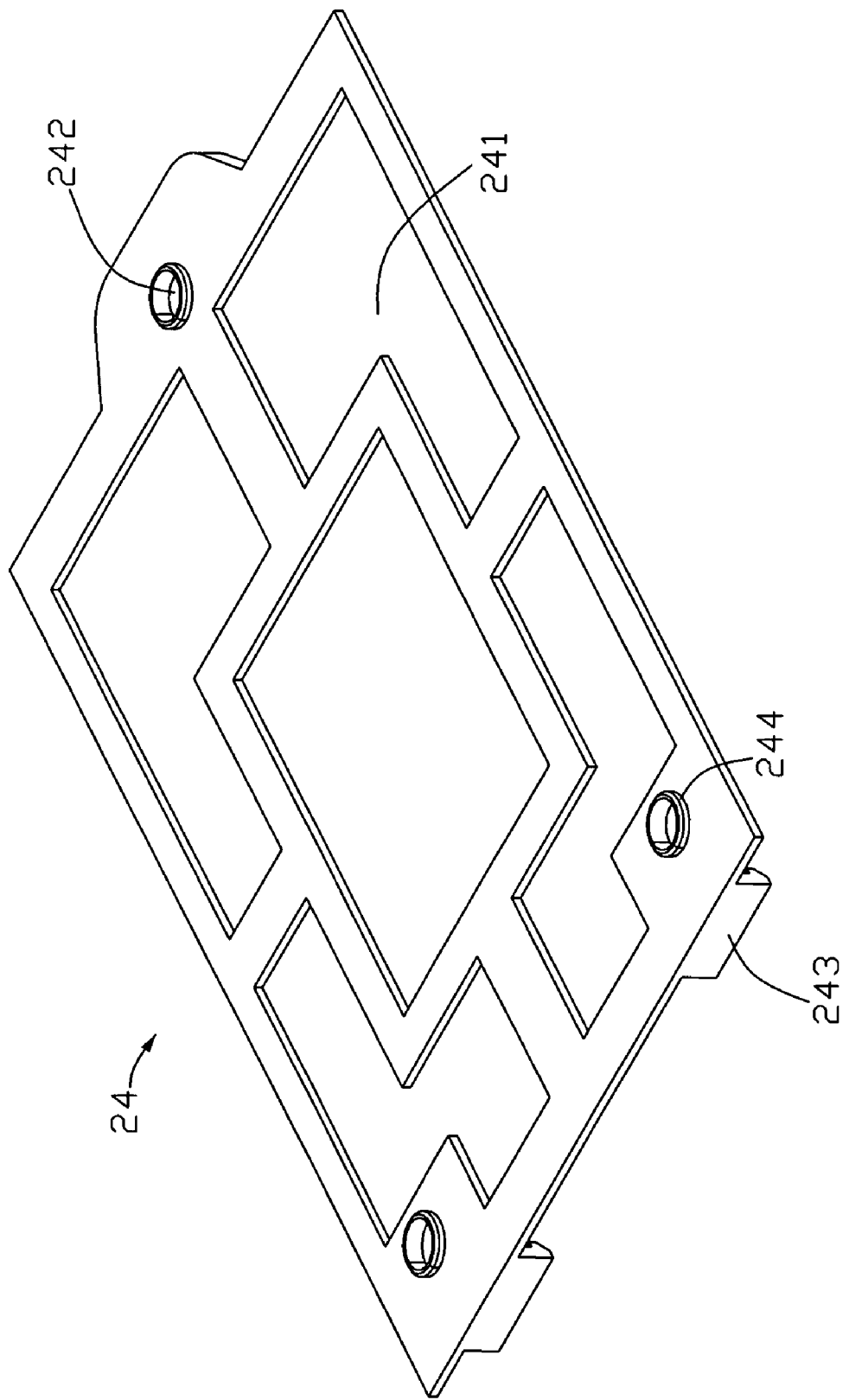
FIG. 7 is a perspective view of an insulative sheet of the socket assembly shown in FIG. 5.

Referring to FIG. 7, the insulative sheet 24, which is also configured with flat board-like shape with a plurality of openings 241 in a center thereof, is sandwiched between the metal backplane 25 and the PCB 23. The insulative sheet 24 defines a plurality of positioning holes 242 according to the circular holes 231 of the PCB 23 and has four latches 243 extending downwardly from two ends of two opposed sides thereof, respectively, to latch two corresponding sides of the metal backplane 25. The insulative sheet 24 has a plurality of protruding portions 244 extending upwardly from a circumference of the positioning holes 242

Figure 8:
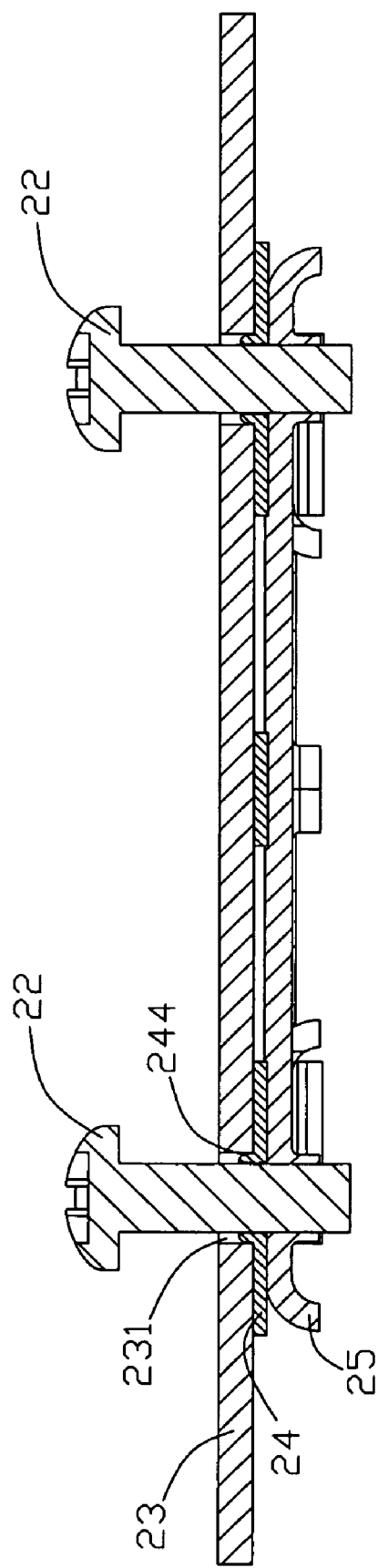
FIG. 8 is an assembled, perspective view of the insulative sheet and a metal plane of the socket assembly shown in FIG. 5.

Referring to FIG. 8, when operator assembles the insulative sheet 24 together with metal backplane 25 to the PCB 23, the protruding portion 244 can be inserted into the circular hole 231 of the PCB 23 for positioning the insulative sheet 24 to the PCB 23, so operator can easily and correctly assemble the socket assembly 2.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket assembly mounted on a printed circuit board comprising:
   a socket mounted upon the printed circuit board;
   a metal backplane, mounted below the printed circuit board and configured with a board-like shape;
   an insulative sheet sandwiched between the printed circuit board and the metal backplane, the insulative sheet formed with at least one latching portion extending downwardly to latch the metal backplane; and
   additional three latching portions, the four latches extend from two ends of two opposed sides of the insulative sheet, respectively;
   wherein a plurality of fasteners pass through a plurality of holes defined on the socket, the insulative sheet and the metal backplane to assemble them together; and
   wherein the insulative sheet is formed with a plurality of protruding portions inserting into holes defined on the printed circuit board.

2. A socket assembly comprising:
   a printed circuit board defining a plurality of circular holes;
   a socket mounted upon the printed circuit board;
   a metal backplane, mounted below the printed circuit board and configured with a board-like shape, and defining a plurality of assembling holes according to the circular holes of the printed circuit board; and
   an insulative sheet sandwiched between the printed circuit board and the metal backplane, the insulative sheet defining a plurality of positioning holes according to the circular holes of the printed circuit board and formed with at least two protruding portions each extending upwardly from a circumference of the positioning hole and inserting into corresponding circular holes of the printed circuit board, respectively;
   wherein the insulative sheet has a plurality of latches each extending from a side of the insulative sheet to latch the metal backplane; and
   wherein a plurality of fasteners pass through the circular holes of the socket, the positioning holes of the insulative sheet and the assembling holes of the metal backplane to assemble them together.

3. A socket assembly comprising:
   a printed circuit board defining opposite first and second surfaces;
   a connector housing mounted upon the first surface and defining a receiving space in an upper face thereof;
   a plurality of contacts disposed in the connector housing with contacting sections upwardly extending into the receiving space;
   a metallic cover moveably positioned upon the connector housing to hold an IC package upon the connector housing;
   opposite mounting regions mounted upon the first surface and located by two opposite front and rear ends of the housing in a front-to-back direction;
   a metallic reinforcement backplane and an insulative sheet commonly positioned upon the second surface under condition of said insulative sheet sandwiched between the backplane and the printed circuit board; wherein
   fastening devices are located by said two opposite ends of the housing, each extending through the mounting region, the printed circuit board, the insulative sheet and the backplane;
   wherein the insulative sheet is associated with the backplane via at least one hook;
   wherein said insulative sheet defines portions extending from the second surface to the first surface for engagement with the printed circuit board; and
   wherein said portion engages the corresponding fastening device.

* * * * *